US008350557B2

(12) United States Patent
Sun et al.

(10) Patent No.: US 8,350,557 B2
(45) Date of Patent: Jan. 8, 2013

(54) NONLINEAR DEGREE MEASURING APPARATUS AND METHOD FOR A POWER AMPLIFIER, PREDISTORTION COMPENSATION APPARATUS

(75) Inventors: Gang Sun, Beijing (CN); Jian Min Zhou, Beijing (CN); Zhan Shi, Beijing (CN); Hui Li, Beijing (CN)

(73) Assignee: Fujitsu Limited, Kawasaki (JP)

( * ) Notice: Subject to any disclaimer, the term of this patent is extended or adjusted under 35 U.S.C. 154(b) by 509 days.

(21) Appl. No.: 12/542,330

(22) Filed: Aug. 17, 2009

(65) Prior Publication Data
US 2010/0039100 A1    Feb. 18, 2010

(30) Foreign Application Priority Data
Aug. 18, 2008  (CN) .......................... 2008 1 0129795

(51) Int. Cl.
*G01R 1/30* (2006.01)
(52) U.S. Cl. .................................................. 324/123 R
(58) Field of Classification Search .................. None
See application file for complete search history.

(56) References Cited

U.S. PATENT DOCUMENTS

| | | | | |
|---|---|---|---|---|
| 5,760,646 A * | 6/1998 | Belcher et al. | ............... | 330/149 |
| 5,877,653 A * | 3/1999 | Kim et al. | ............... | 330/149 |
| 5,898,338 A * | 4/1999 | Proctor et al. | ............... | 330/149 |
| 6,046,635 A * | 4/2000 | Gentzler | ............... | 330/149 |
| 6,246,286 B1 * | 6/2001 | Persson | ............... | 330/149 |
| 6,275,103 B1 * | 8/2001 | Maniwa | ............... | 330/149 |
| 6,600,792 B2 | 7/2003 | Antonio et al. | | |
| 7,149,257 B2 * | 12/2006 | Braithwaite | ............... | 375/296 |
| 8,014,443 B2 * | 9/2011 | Nakamura et al. | ............... | 375/232 |
| 8,170,819 B2 * | 5/2012 | Raghavan et al. | ............... | 324/76.12 |
| 2005/0253745 A1 * | 11/2005 | Song et al. | ............... | 341/118 |
| 2009/0138226 A1 * | 5/2009 | Raghavan et al. | ............... | 702/107 |
| 2009/0207938 A1 * | 8/2009 | Jeong et al. | ............... | 375/296 |
| 2009/0309657 A1 * | 12/2009 | Li et al. | ............... | 330/149 |
| 2011/0068868 A1 * | 3/2011 | Shi et al. | ............... | 330/149 |

FOREIGN PATENT DOCUMENTS

| | | |
|---|---|---|
| JP | 2000078037 A | 3/2000 |
| JP | 2005150814 A | 6/2005 |
| JP | 2007013230 A | 1/2007 |
| JP | 2008258713 A | 10/2008 |
| WO | 2007046370 A1 | 4/2007 |

OTHER PUBLICATIONS

Notification of Reasons for Refusal dated Feb. 14, 2012 issued in Japanese Patent Application No. 2009-189488.
Chinese Office Action dated Dec. 13, 2011 issued in 200810129795.0.
Japanese Notification of Reasons for Refusal Office Action dated Oct. 9, 2012 received in JP Patent Application No. 2009-189488.

* cited by examiner

*Primary Examiner* — Jermele M Hollington
(74) *Attorney, Agent, or Firm* — Murphy & King, P.C.

(57) ABSTRACT

This invention relates to a nonlinear degree measuring apparatus and method for a power amplifier, and a predistortion compensation apparatus. The nonlinear degree measuring apparatus comprises a delayer (304), for delaying inputted pilot frequency data; a subtracter (305), for subtracting, from the pilot frequency data delayed by the delayer, subsequently inputted pilot frequency data; a power calculating unit (306), for calculating an instantaneous power of an outputted signal from the subtracter (305); and an averager (307), for averaging the instantaneous power calculated by the power calculating unit (306) to obtain an averaged power.

10 Claims, 4 Drawing Sheets

NONLINEAR DEGREE MEASURING APPARATUS AND METHOD FOR A POWER AMPLIFIER, PREDISTORTION COMPENSATION APPARATUS

FIELD OF THE INVENTION

The present application relates to power amplifiers, and more particularly to a predistortion compensation apparatus and method of a power amplifier.

BACKGROUND OF THE RELATED ART

Power amplifier (PA) is an important component part in an electronic apparatus, as it is capable of amplifying the power of weak electric signals to satisfy the requirements of transmission and emission. The energy for amplification derives from a direct current power supply. That is to say, PA converts the direct current energy into an alternating current signal, so that power intensity of the alternating current signal meets requirements. The capability of PA to convert direct current energy into alternating current energy is referred to as efficiency of PA. The power relationship between input and output signals of PA can be divided into a linear region, a nonlinear region and a saturation region.

When the envelope of an input signal fluctuates only in the linear region, the input signal is ideally amplified. Whereas when the envelope of the input signal fluctuates to the nonlinear region, the output signal will be distorted. Such distortion manifests in the time domain to the effect that the output signal is not an ideal amplification of the input signal, and in the frequency domain to the effect that the side lobe of the spectrum of the output signal rises while the main lobe is distorted. This is not desirable.

Due to physical reasons, when envelope fluctuation of the input signal gets deeper into the nonlinear region, efficiency of PA will be much higher than that in the case of fluctuation merely in the linear region. Moreover, with the advent of novel modulation modes, dynamic range of the signal envelope becomes larger and larger, so that nonlinear distortion is inevitable, and the gist of relevant techniques rests in how to overcome such nonlinearity.

Baseband predistortion technique is an effective means in combating PA nonlinearity. The technique carries out predistortion on the baseband digital signal in advance by simulating the inverse characteristics of PA nonlinearity, so as to obtain the ideally amplified signal at the output terminal of PA.

Basic inverse characteristics of PA can be obtained through measurement, and are integrated into a predistortion module of PA as predistortion data. Due to influences of such factors as temperature, humidity and element aging, inverse characteristics of PA will be subject to change. There is hence the need to adaptively adjust the predistortion data in accordance with changes in the inverse characteristics of PA. It is necessary for the classical method (vector method) to precisely compare input data of PA with output data as fed back during operation of PA, and this brings about such problems as precise synchronization and guarantee of IQ balancing, while solutions to these problems entail considerable costs on circuits.

Predistortion methods that take scalar information such as out-band power or in-band/out-band power ratios of the output signal of the PA as the optimization objective can avoid the influence of delays of the feedback loop, and are more convenient and effective. Such methods are collectively referred to as the scalar method.

With the development of wireless communications technology, various digital modulation modes (such as 16QAM/64QAM/OFDM) with high spectral efficiencies are widely used, but these modulation modes lead to higher peak-to-average power ratio (PAPR) of the envelope of a transmitted signal, thereby putting a very high demand on the linearity of the power amplifier (PA) of the transmitter. Digital predistortion technique of the scalar method has also been given increasingly more attention.

FIG. 1 schematically illustrates a block diagram of a power amplification apparatus employing the digital predistortion technique of the scalar method. The power amplification apparatus is used for instance in a transmitter of a base station or a user terminal in a wireless communications system.

As shown in FIG. 1, having been distortion-compensated by a distortion compensator 201, the source signal from a signal source 100 is converted into an analog signal by a digital-to-analog converter 300, and is then converted by an up-converter 400 into an RF signal to be inputted into a power amplifier 500. The output signal from the power amplifier 500 is transmitted by an antenna 600. Meanwhile, a portion of the output signal from the power amplifier is fed back through coupling, is subsequently transformed to a baseband via a down-converter 205, and is sampled by an analog-to-digital converter 204.0 to obtain a digital baseband signal. This baseband signal carries therewith nonlinear characteristics of the power amplifier. An in-band/out-band power ratio calculating module 203 performs digital signal processing on the baseband signal to obtain the in-band/out-band power ratio of the output signal from the power amplifier. In accordance with the in-band/out-band power ratio, a parameter updater 202 updates parameters of a predistorter by means of an optimization algorithm to thereby achieve an adaptive predistortion process.

Very high demands are put on the analog-to-digital converter 204.0 of the feedback loop in such methods. In order to obtain the power of an out-band signal, it is necessary to perform more than three times of up-samplings on the feedback signal. However, with regard to a wideband system, the analog-to-digital converter with high sampling rate has great power consumption, is high in cost and therefore difficult for application in such devices which are sensitive to power consumption and cost (a mobile terminal, for example).

Reference Document: "Predistortion technique for high power amplifier", US006600792.

SUMMARY OF THE INVENTION

The present invention proposes a novel cost function and an apparatus for realization thereof with regard to the digital predistortion technique of the scalar method to overcome one or more of the aforementioned defects existing in the prior art and to provide one advantageous choice at least.

The main concept of the present invention rests in using the harmonic component (which is generated due to power amplifier nonlinearity) carried by a pilot (in-band signal) in the frequency domain of a transmitted signal to calculate a cost value (namely nonlinear degree metric value), and then employing an optimization algorithm to optimize the cost value and update parameters of a predistorter, so as to achieve the adaptive predistortion process.

In order to achieve the above objectives, the present application specifically provides the following aspects in accordance with the concept of the present invention.

Aspect 1: A nonlinear degree measuring apparatus for a power amplifier, comprising a delayer, for delaying inputted pilot frequency data; a subtracter, for subtracting, from the pilot frequency data delayed by the delayer, subsequently inputted pilot frequency data; a power calculating unit, for calculating an instantaneous power of an outputted signal from the subtracter; and an averager, for averaging the power calculated by the power calculating unit to obtain an averaged power.

Aspect 2: The nonlinear degree measuring apparatus according to aspect 1, wherein further comprising a pilot frequency extracting unit, for extracting the pilot frequency data and transmitting the extracted pilot frequency data to the delayer and the subtracter.

Aspect 3: The nonlinear degree measuring apparatus according to aspect 2, wherein the pilot frequency extracting unit comprises a symbol synchronizing unit, for synchronizing an inputted signal; a subcarrier data obtaining unit, for obtaining data on each subcarrier of a frequency domain; and a pilot frequency data extracting unit, for extracting the pilot frequency data, on the subcarrier of the pilot frequency from the data on each subcarrier of the frequency domain obtained by the subcarrier data obtaining unit.

Aspect 4: The nonlinear degree measuring apparatus according to aspect 3, wherein the symbol synchronizing unit is a coarse synchronizing unit.

Aspect 5: The nonlinear degree measuring apparatus according to aspect 3, wherein the subcarrier data obtaining unit is a fast Fourier transformation unit that performs fast Fourier transformation on the synchronized inputted signal to obtain data on each subcarrier of the frequency domain.

Aspect 6: A predistortion compensation apparatus for use in a wireless communication device, the predistortion compensation apparatus comprising a parameter updater and a nonlinear degree measuring apparatus for a power amplifier, wherein the nonlinear degree measuring apparatus comprises a delayer, for delaying inputted pilot frequency data; a subtracter, for subtracting, from the pilot frequency data delayed by the delayer, subsequently inputted pilot frequency data; a power calculating unit, for calculating an instantaneous power of an outputted signal from the subtracter; and an averager, for averaging the power calculated by the power calculating unit to obtain an averaged power.

Aspect 7: The predistortion compensation apparatus according to aspect 6, wherein the wireless communication device comprises a transmitter and a receiver operating in TDD mode, wherein the receiver comprises a pilot frequency extracting unit, and the predistortion compensation apparatus extracts pilot frequency data by using the pilot frequency extracting unit and transmits the extracted pilot frequency data to the delayer and the subtracter.

Aspect 8: The predistortion compensation apparatus according to aspect 6, wherein the nonlinear degree measuring apparatus further comprises a pilot frequency extracting unit.

Aspect 9: The predistortion compensation apparatus according to aspect 8, wherein the pilot frequency extracting unit includes a symbol synchronizing unit, for synchronizing an inputted signal; a subcarrier data obtaining unit, for obtaining data on each subcarrier of a frequency domain; and a pilot frequency data extracting unit, for extracting data, i.e. the pilot frequency data, on the subcarrier of the pilot frequency from the data on each subcarrier of the frequency domain obtained by the subcarrier data obtaining unit.

Aspect 10: The predistortion compensation apparatus according to aspect 6, wherein the parameter updater performs parameter update by pattern search method or steepest descent method in accordance with a measuring value obtained by the power amplifier nonlinear degree measuring apparatus.

Aspect 11: A nonlinear degree measuring method for a power amplifier, wherein comprising: delaying inputted pilot frequency data; subtracting, from the pilot frequency data delayed by the delaying, subsequently inputted pilot frequency data; calculating an instantaneous power of a signal obtained by the subtracting; and averaging the power calculated in the calculating to obtain an averaged power.

Since only the pilot frequency signal (in-band signal) is required to complete calculation of the cost value, although operation of the analog-to-digital converter under the nyquist sampling frequency causes aliasing of the out-band harmonic signal into the band, the aliased signal can as well be effectively utilized as it still represents to certain extent the nonlinear characteristics of the power amplifier, and it is therefore possible for the analog-to-digital converter to operate under the nyquist sampling frequency. Accordingly, it is possible not only to effectively utilize the out-band aliased signal, but also to reduce power consumption and cost of the analogue-to-digital converter.

With reference to the following description and drawings, these and other aspects and features of the present invention will become apparent. Specific embodiments are disclosed in detail in the description and drawings, thus specifying the modes applicable according to the concept of the present invention. As should be understood, the scope of the present invention shall not be restricted thereby, as the present invention includes various variations, modifications and analogues within the spirit and proviso covered by the attached claims.

Features described and/or illustrated with regard to one embodiment or example can be used in the same or similar manner in one or more other embodiments or examples, be combined with features of other embodiments or examples, or replace features of other embodiments or examples.

As should be noted, the term of "including/comprising" as used in this paper indicates existence of a feature, an integral, a step or a component part, but it does not exclude the existence or addition of one or more other features, integral, steps or component parts.

Many aspects of the present invention can be better comprehended with reference to the following drawings. Component parts in the drawings are not drawn in proportion, but merely indicate principles of the present invention. Elements and features illustrated in one Figure or one embodiment can be combined with elements and features illustrated in one or more of other Figures or embodiments. Moreover, similar reference numerals in the drawings indicate corresponding component parts illustrated in several Figures, and can also indicate corresponding component parts employed in more than one embodiment. Furthermore, for the sake of brevity and cartographic simplicity, other component parts known to persons skilled in the art which should also exist are not shown in the drawings.

DRAWINGS ACCOMPANYING THE DESCRIPTION

Preferred embodiments of the present invention are shown in the drawings, and the drawings constitute a part of the application and are employed together with the Descriptions to further enunciate the principles of the present invention. In the drawings.

DETAILED DESCRIPTION OF THE INVENTION

Figure 1:
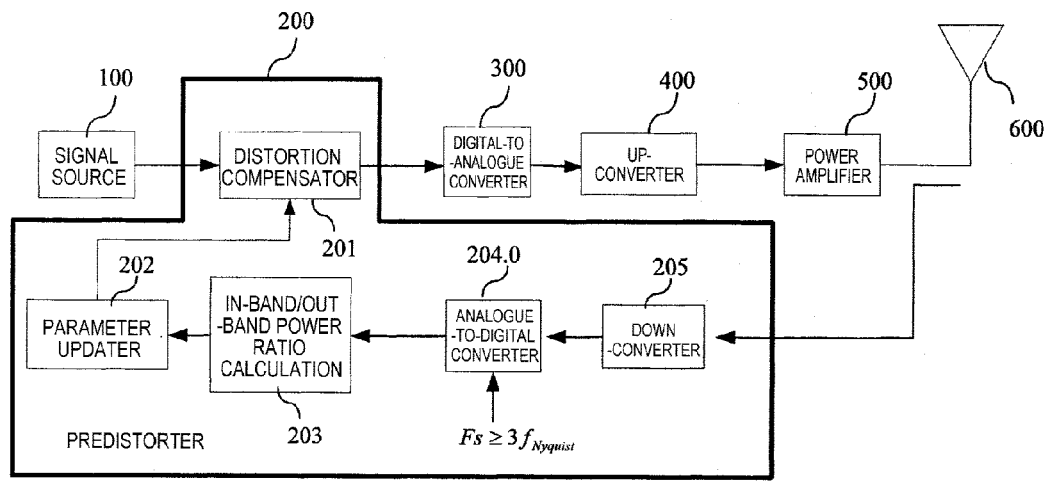
FIG. 1 is a block diagram schematically illustrating a power amplification apparatus employing the digital predistortion technique of the scalar method.
Figure 2:
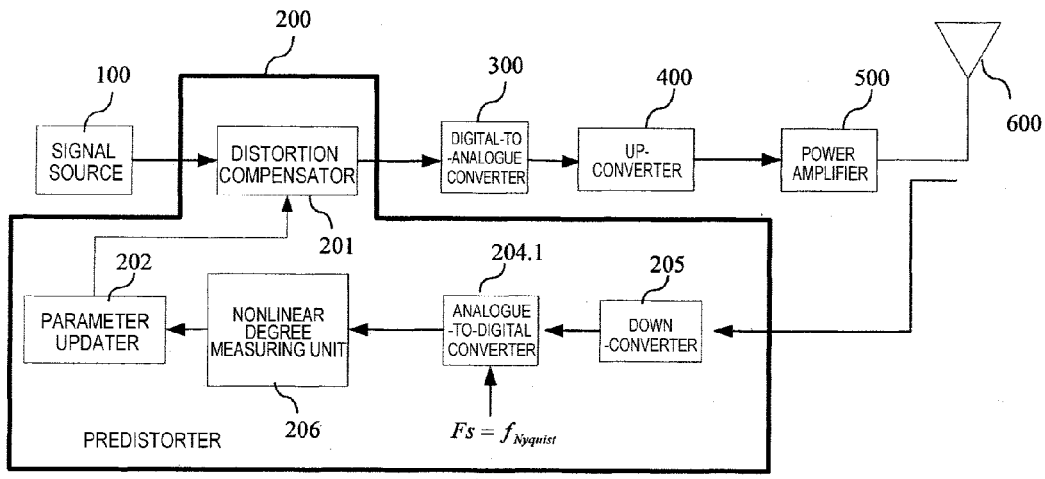
FIG. 2 is a block diagram schematically illustrating the structure of a power amplification apparatus according to one embodiment of the present invention.

FIG. 2 is a block diagram schematically illustrating the structure of a power amplification apparatus according to one embodiment of the present invention. The power amplification apparatus can be used for instance in a transmitter of a user terminal or a base station in a wireless communications system. The power amplification apparatus can also be used in other apparatuses needing a power amplifier, such as the transmitters of a satellite or radar. As a matter of fact, the present invention is applicable to any system with pilot frequencies in its frequency domain. In other words, the communication system according to the present invention includes any system in which the frequency domain of the signal used has pilot frequencies. The following description is made in the context the power amplification apparatus is used in a user terminal.

As shown in FIG. 2, having been distortion-compensated by a distortion compensator 201, the source signal from a signal source 100 is converted into an analog signal by a digital-to-analog converter 300. The analog signal is then converted by an up-converter 400 into an RF signal to be inputted into a power amplifier 500. The output signal (power-amplified output signal) from the power amplifier 500 is transmitted by an antenna 600, and a portion of the power-amplified output signal is fed back.

In the case the power amplification apparatus is used in a user terminal, the source signal of the signal source 100 is for instance a 16 QAM signal, a 64 QAM signal, or an OFDM signal outputted from a modulator. The signal source in this context means any apparatus capable of generating signals to be amplified by the power amplification apparatus according to the present invention, and may include a signal generating device, a pilot frequency insertion device, and an IFFT device, etc.

Moreover, although FIG. 2 merely shows the component parts (such as the power amplifier 500, the up-converter 400 and the distortion compensator 201) involved in power amplification and the transmission antenna 600, it would be aware to persons skilled in the art that this user terminal may also include other component parts capable of achieving various functions of the user terminal.

Furthermore, as should be noted, when the power amplification apparatus is used in other apparatuses, the transmission antenna will be replaced by other component parts that use power-amplified output signals.

The fed-back portion of the power-amplified output signal is transformed to a baseband signal after passing through a down-converter 205, and a digital baseband signal is obtained through sampling by an analogue-to-digital converter 204.1. Utilizing this baseband signal, the nonlinear degree measuring unit 206 determines the degree of nonlinearity of the power amplifier. The metric value of the degree of nonlinearity is also referred to in this paper as a cost value.

Subsequently, a parameter updater 202 updates parameters of the predistorter in accordance with the cost value to thereby achieve the adaptive predistortion process.

Figure 3:
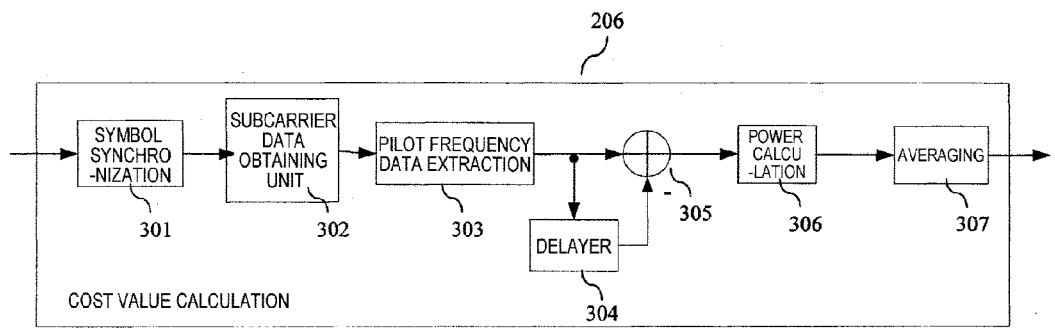
FIG. 3 is a block diagram schematically illustrating the structure of a nonlinear degree measuring unit 206 in the OFDM system.

FIG. 3 is a block diagram schematically illustrating the structure of the nonlinear degree measuring unit 206 in the OFDM system.

The signal output from the analogue-to-digital converter 204.1 is firstly symbol-synchronized by a symbol synchronizing unit 301. The symbol here is the OFDM symbol, and is also referred to as input signal as context demands. Symbol synchronization means the procedure to synchronize the feedback signal with the transmitted signal to find the starting point of the symbol. Each symbol contains a cyclic prefix having a predetermined length. It is preferable in the present invention that the symbol synchronizing unit 301 is a symbol coarsely synchronizing unit. Coarse synchronization means in this context that it suffices for the synchronization error to be less than the length of the cyclic prefix, and it is unnecessary to perform synchronization of higher precision. Coarse synchronization can be carried out based on the correlation peak detection algorithm of the cyclic prefix. The mere coarse synchronization can reduce processing load, lower the demand on performance of the processing element, and hence reduce cost. Employment of coarse synchronization does not affect the performance.

A subcarrier data obtaining unit 302 obtains frequency spectrums of symbols from coarsely synchronized signals, i.e. data on each subcarrier in the frequency domain. In one embodiment, the subcarrier data obtaining unit 302 is realized by a fast Fourier transformation (FFT) unit. As should be noted, in this embodiment it is supposed that the signal inputted to the distortion compensator 201 (namely the signal from the signal source 100) has been performed with IFFT transformation, so that the signal inputted to the symbol synchronizing unit 301 has also been performed with IFFT transformation, and the fast Fourier transformation (FFT) unit is therefore used. If the signal from the signal source 100 has been performed with other processings, the method employed by the subcarrier data obtaining unit 302 will also be correspondingly changed as long as it is possible to extract the data on each subcarrier in the frequency domain.

Subsequently, a pilot frequency data extracting unit 303 extracts the data on the pilot frequency subcarrier. The pilot frequency subcarrier should be broadly understood in this paper, as it includes any subcarrier whose position and data have been agreed upon by both of the receiver and the transmitter.

After the extracted data is delayed by a delayer 304, a subtracter 305 subtracts data on the identical pilot frequency subcarriers of subsequent symbols from the data delayed by the delayer 304. In this paper, when the pilot frequency data on the pilot frequency subcarrier of the current symbol is regarded as the current pilot frequency data, the pilot frequency data corresponding to the pilot frequency subcarrier of a symbol immediately following the current symbol is referred to as the subsequent pilot frequency data. Preferably, with regard to the symbol to which the data before being delayed by the delayer 304 corresponds, the subtracter 305 subtracts the data on the same pilot frequency subcarrier of a next symbol of this symbol from the signal delayed by the delayer 304.

A power calculating unit 306 then calculates the power (instantaneous power) of the difference, namely calculates the square of modulus of the difference. The power is outputted as the cost value after being averaged by an averager 307.

As should be noted, the aforementioned symbol synchronizing unit 301, FFT unit 302 and pilot frequency data extracting unit 303 together constitute the pilot frequency extracting unit for the objective of extracting pilot frequency. It is only exemplary for the pilot frequency extracting unit to include the symbol synchronizing unit 301, FFT unit 302 and pilot frequency data extracting unit 303, as it is possible to extract pilot frequency by any method and apparatus known to persons skilled in the art.

Principles of the present invention are explained in the following paragraphs.

Suppose the data on the $k^{th}$ pilot frequency subcarrier of the $i^{th}$ symbol is $P_{i,k}$, then it can be expressed as: $P_{i,k}=H_{i,k}A+ICI_{i,k}$, where $H_{i,k}$ is the frequency response of the entire loop (namely the path through which the signal passes from insertion to extraction of the pilot frequency) on the $k^{th}$ pilot frequency subcarrier of the $i^{th}$ symbol, $ICI_{i,k}$ is the harmonic component of the $k^{th}$ pilot frequency subcarrier of the $i^{th}$ symbol, and A is an undistorted pilot frequency signal.

Since the frequency response of the entire loop can be considered as invariant over different symbols, output of the subtracter 305 can be expressed as: $D_{i,k}=H_{i,k}A+ICI_{i,k}-H_{i-1,k}A-ICI_{i-1,k}=ICI_{i,k}-ICI_{i-1,k}$, then the output cost value (an average of power of the signals outputted by the subtracter) can be expressed as: $Metric_i=E(|D_{i,k}|^2)=E(|ICI_{i,k}|^2)+E(|ICI_{i-1,k}|^2)-2Re(E(ICI_{i,k}ICI^*_{i-1,k}))$, where $E(\bullet)$ indicates mathematical expectation, $Re(\bullet)$ indicates obtaining the real part of the complex number, and * indicates conjugation. Calculation of the square of the absolute value is in fact determination of the instantaneous power. Getting the mean value is to calculate the average power in accordance with the instantaneous power.

If we suppose $ICI_{i,k}$, $ICI_{i-1,k}$ are statistically independent, the cost value can be expressed as: $Metric_i=E(|D_{i,k}|^2)=E(ICI_{i,k}|^2)+E(ICI_{i-1,k}|^2)-2Re(E(ICI_{i,k})E(ICI^*_{i-1,k}))$. If the mean value of ICI is zero, the above cost value represents the power of the in-band harmonic wave.

Considering stability of the cost value, it is possible to average a plurality of symbols to obtain a relatively stable cost value.

As should be noted, although two adjacent symbols are taken as examples in the above description of the principles, the symbols are not necessarily adjacent to each other as previously mentioned and the two symbols can be spaced from each other by several symbols, as it suffices for the symbols to have identical pilot frequency subcarrier.

In summary, measurement of the cost value of PA nonlinear degree is calculated by using the in-band pilot frequency, rather than directly measuring the out-band power. Accordingly, it does not require very high sampling rate for the analogue-to-digital converter to measure the out-band signal power. The nyquist sampling rate is sufficient (ensured by sampling theory) in the case the in-band pilot frequency is used alone.

As shown in FIG. 2, the sampling rate of the analogue-to-digital converter operates on the nyquist sampling rate, as previously mentioned, the harmonic signal aliasing in-band can be effectively utilized at such frequency, but the application of this method is not affected even if the sampling rate of the analogue-to-digital converter is higher than the nyquist sampling rate. This is because even if the out-band harmonic component does not alias in band, the harmonic component carried by the in-band signal itself can also represent the nonlinear characteristics of the power amplifier. This will be explained in further detail below.

Since PA nonlinearity superposes the harmonic component on the frequency spectrum of the signal, and this harmonic component is distributed both out band and in band. When the sampling rate is equal to the nyquist sampling rate, out-band harmonic wave will alias in band, and both out-band and in-band harmonic components are taken in calculation of the cost value. However, when the sampling rate is greater than the nyquist sampling rate, partial out-band harmonic component will not alias in band. However, at this time the in-band harmonic component itself is also caused by PA nonlinearity, and calculation of the cost value by using partial harmonic component can also represent the PA nonlinear characteristics.

Figure 4:
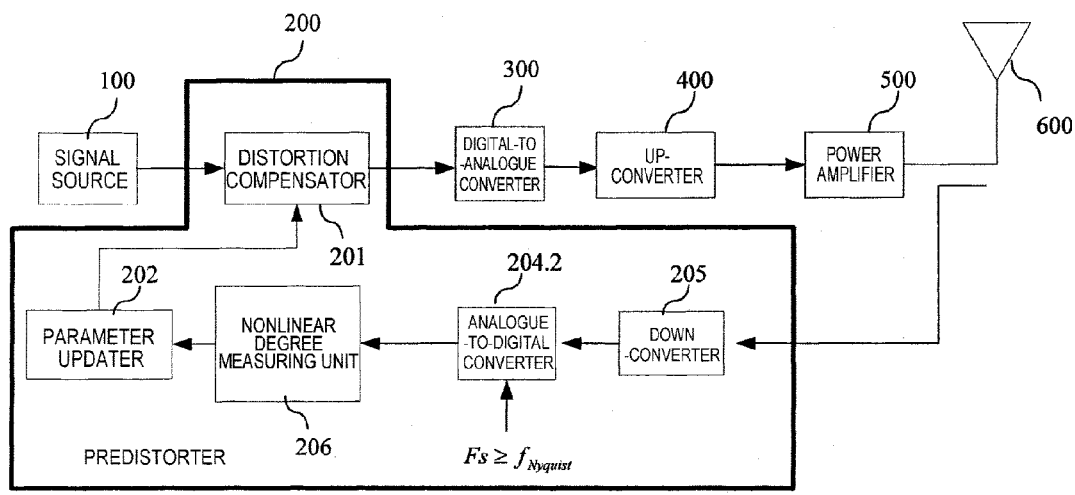
FIG. 4 is a block diagram schematically illustrating the structure of a power amplification apparatus according to another embodiment of the present invention.

FIG. 4 is a block diagram schematically illustrating the structure of a power amplification apparatus according to another embodiment of the present invention. The power amplification apparatus in FIG. 4 differs from that in FIG. 2 by replacing the analogue-to-digital converter 204.1 in FIG. 2 with the analogue-to-digital converter 204.2. That is to say, in FIG. 4 the analogue-to-digital converter 204.2 operates on a sampling rate equal to or greater than the nyquist sampling rate, whereas in FIG. 2 the analogue-to-digital converter 204.1 operates on a sampling rate equal to the nyquist sampling rate.

The parameter updater 202 can employ classical adaptive algorithms such as the pattern search method or the steepest descent method to update parameters. The steepest descent method is now taken as an example to briefly describe how parameters are updated by using the cost value. Suppose at timing t the $i^{th}$ parameter to be updated is $\omega_i(t)$, N parameters to be updated is expressed as $\omega(t)=[\omega_1(t), \omega_2(t), \ldots \omega_N(t)]$, step length of parameter update is $\mu$, and the cost value calculated at timing t is $J(\omega(t))$, then the update algorithm can be expressed as:

$$\omega_i(t+1) = \omega_i(t) - \mu \frac{\partial(J(\omega(t)))}{\partial \omega_i}.$$

The above parameter update process is an iterative process, and condition to end iteration is for $J(\omega(t))$ to be less than a preset target value.

Similarly, parameters can also be updated by employing the classical adaptive algorithm such as the pattern search method. As a matter of fact, the parameter updater can employ any method already known or to be known to persons skilled in the art to perform parameter update.

Figure 5:
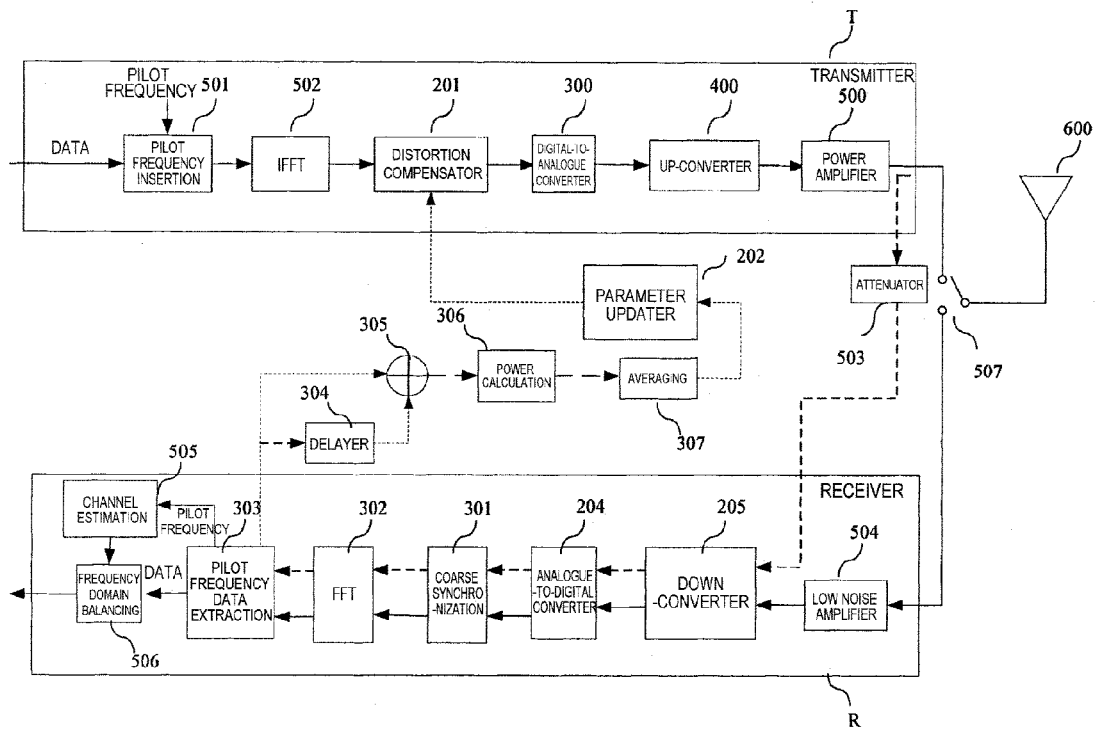
FIG. 5 shows an embodiment in which a predistorter in the OFDM system shares circuits with a receiving circuit.

In the TDD system of OFDM, since transmission of signals and reception of signals operate on the same frequency, the mode of time multiplexing is used. In other words, the receiving circuit does not operate during transmission of signals. Consequently, this characteristic can be made full use of to let the predistortion system to share circuits with the receiving circuit as far as possible, so as to reduce the scale of circuits in the predistortion system. This is of great significance to such devices which are sensitive to power consumption and cost (a mobile terminal, for instance). FIG. 5 shows a concrete example in which a predistorter in the OFDM system shares circuits with a receiving circuit.

In FIG. 5, a transmitter T and a receiver R realize time division multiplexing via a switch 507 to share an antenna 600. The transmitter T includes a pilot frequency insertion unit 501, an IFFT unit 502, a distortion compensator 201, a digital-to-analogue converter 300, an up-converter unit 400 and a power amplifier 500. The receiver R includes a low noise amplifier 504, a down-converter 205, an analogue-to-digital converter 204, a coarsely synchronizing unit 301, an FFT unit 302, a pilot frequency data extracting unit 303, a channel estimating unit 505 and a frequency domain equalizer 506. Signal flow of the predistortion system is illustrated in dashed lines. When the transmitter T transmits a signal, the receiver R does not operate, and the output signal from the power amplifier 500 passes through a coupling attenuator 503 to enter the operating circuit of the receiver R, so that the predistorter shares circuits with the receiver. Comparing FIG. 3 against FIG. 5, the down-converter 205, the analogue-to-digital converter 204, the coarsely synchronizing circuit 301, the FFT 302 and the pilot frequency data extracting unit 303 of the predistortion system can all share with the receiving circuit, so as to indirectly reduce the scale of circuits in the predistortion system. This is another advantageous effect of the present invention.

Figure 6:
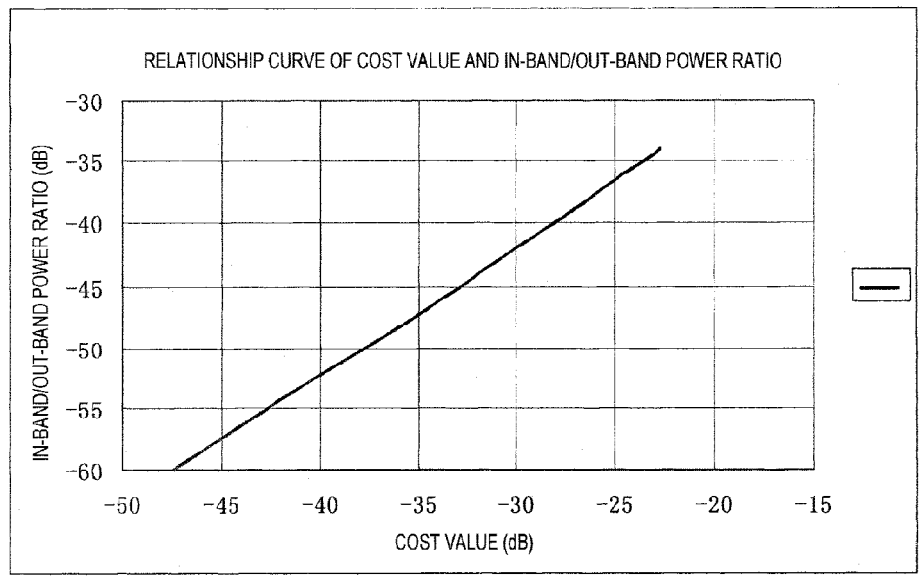
FIG. 6 shows a relationship curve between the cost value and the in-band/out-band power ratio according to the present invention.

Under the 10 MHZ bandwidth condition of 802.16e, FIG. 6 provides a relationship curve between the cost value and the in-band/out-band power ratio according to the present invention. As can be known from FIG. 6, there is a monotonic relationship between the cost value as proposed in the present invention and the in-band/out-band power ratio. Accordingly, the cost value can be used to measure PA nonlinear degree.

As should be noted, the transmitter and the receiver described here are both exemplary in nature, and they may also be other additional or alternative or optional devices known to persons skilled in the art.

Figure 7:
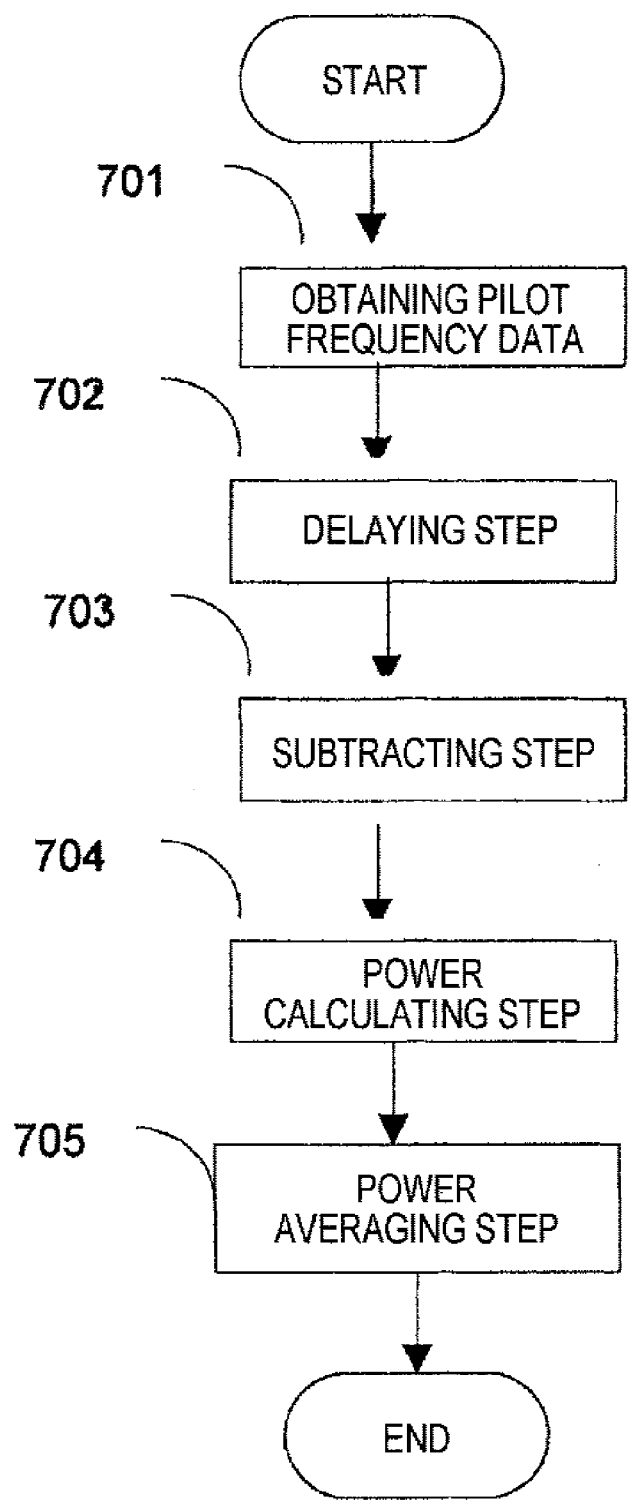
FIG. 7 is a schematical flowchart illustrating the power amplifier nonlinear degree measuring method according to one embodiment of the present invention.

FIG. 7 is a schematical flowchart illustrating the power amplifier nonlinear degree measuring method according to one embodiment of the present invention. As shown in FIG. 7, according to one embodiment of the present invention, the power amplifier nonlinear degree measuring method of the present invention comprises a delaying step (702), for delaying inputted pilot frequency data; a subtracting step (703), for subtracting, from the pilot frequency data delayed in the delaying step, subsequently inputted pilot frequency data; a power calculating step (704), for calculating an instantaneous power of a signal obtained in the subtracting step; and an averaging step (705), for averaging the power calculated in the power calculating step to obtain an averaged power.

In one embodiment of the present invention, the power amplifier nonlinear degree measuring method of the present invention further comprises a pilot frequency data extracting step 701 for extracting pilot frequency data. Extraction of pilot frequency data can be accomplished for instance by using the aforementioned symbol synchronizing unit 301, the subcarrier data obtaining unit and the pilot frequency data extracting unit 303 with methods discussed above.

What is claimed is:

1. A nonlinear degree measuring apparatus for a power amplifier, wherein comprising:
    a delayer, for delaying pilot frequency data of current symbol of an inputted signal;
    a subtracter, for subtracting, from the pilot frequency data delayed by the delayer, pilot frequency data of subsequent symbol of the inputted signal;
    a power calculating unit, for calculating an instantaneous power of an outputted signal from the subtracter; and
    an averager, for averaging the power calculated by the power calculating unit to obtain an averaged power.

2. The nonlinear degree measuring apparatus according to claim 1, wherein further comprising a pilot frequency extracting unit, for extracting the pilot frequency data and transmitting the extracted pilot frequency data to the delayer and the subtracter.

3. The nonlinear degree measuring apparatus according to claim 2, wherein the pilot frequency extracting unit comprises:
    a symbol synchronizing unit, for synchronizing an inputted signal;
    a subcarrier data obtaining unit, for obtaining data on each subcarrier of a frequency domain; and
    a pilot frequency data extracting unit), for extracting pilot frequency data, on the subcarrier of the pilot frequency from the data on each subcarrier of the frequency domain obtained by the subcarrier data obtaining unit.

4. The nonlinear degree measuring apparatus according to claim 3, wherein that the symbol synchronizing unit is a coarse synchronizing unit.

5. The nonlinear degree measuring apparatus according to claim 3, wherein that the subcarrier data obtaining unit is a fast Fourier transformation unit that performs fast Fourier transformation on the synchronized inputted signal to obtain data on each subcarrier of the frequency domain.

6. A predistortion compensation apparatus for use in a wireless communication device, the predistortion compensation apparatus comprising a parameter updater and a nonlinear degree metric apparatus for a power amplifier, wherein the nonlinear degree metric apparatus comprising:
    a delayer, for delaying pilot frequency data of current symbol of an inputted signal;
    a subtracter, for subtracting, from the pilot frequency data delayed by the delayer, pilot frequency data of subsequent symbol of the inputted signal;
    a power calculating unit, for calculating an instantaneous power of an outputted signal from the subtracter; and
    an averager, for averaging the power calculated by the power calculating unit (306) to obtain an averaged power.

7. The predistortion compensation apparatus according to claim 6, wherein that the wireless communication device comprises a transmitter and a receiver operating in TDD mode, wherein the receiver comprises a pilot frequency extracting unit, and the predistortion compensation apparatus extracts pilot frequency data by using the pilot frequency extracting unit and transmits the extracted pilot frequency data to the delayer and the subtracter.

8. The predistortion compensation apparatus according to claim 6, wherein that the nonlinear degree measuring apparatus further comprises a pilot frequency extracting unit comprising:
    a symbol synchronizing unit, for synchronizing an inputted signal;
    a subcarrier data obtaining unit, for obtaining data on each subcarrier of a frequency domain; and
    a pilot frequency data extracting unit, for extracting data, i.e. the pilot frequency data, on the subcarrier of the pilot frequency from the data on each subcarrier of the frequency domain obtained by the subcarrier data obtaining unit.

9. The predistortion compensation apparatus according to claim 6, wherein the parameter updater performs parameter update by pattern search method or steepest descent method in accordance with a metric value obtained by the power amplifier nonlinear degree metric apparatus.

10. A nonlinear degree metric method for a power amplifier, wherein comprising:
    delaying pilot frequency data of current symbol of an inputted signal;
    subtracting, from the pilot frequency data delayed by the delaying, pilot frequency data of subsequent symbol of the inputted signal;
    calculating an instantaneous power of a signal obtained by the subtracting; and
    averaging the power calculated in the calculating to obtain an averaged power.

* * * * *